United States Patent
Liu et al.

(10) Patent No.: US 12,393,831 B2
(45) Date of Patent: Aug. 19, 2025

(54) ARTIFICIAL SENSORY NERVOUS CIRCUIT AND MANUFACTURING METHOD THEREOF

(71) Applicant: INSTITUTE OF MICROELECTRONICS OF THE CHINESE ACADEMY OF SCIENCES, Beijing (CN)

(72) Inventors: Qi Liu, Beijing (CN); Zuheng Wu, Beijing (CN); Tuo Shi, Beijing (CN); Ming Liu, Beijing (CN); Hangbing Lv, Beijing (CN); Xumeng Zhang, Beijing (CN); Wei Wang, Beijing (CN)

(73) Assignee: INSTITUTE OF MICROELECTRONICS OF THE CHINESE ACADEMY OF SCIENCES, Beijing (CN)

( * ) Notice: Subject to any disclaimer, the term of this patent is extended or adjusted under 35 U.S.C. 154(b) by 885 days.

(21) Appl. No.: 17/597,720

(22) PCT Filed: Nov. 13, 2019

(86) PCT No.: PCT/CN2019/118112
§ 371 (c)(1),
(2) Date: Jan. 19, 2022

(87) PCT Pub. No.: WO2021/056748
PCT Pub. Date: Apr. 1, 2021

(65) Prior Publication Data
US 2022/0261621 A1 Aug. 18, 2022

(30) Foreign Application Priority Data
Sep. 26, 2019 (CN) .............................. 201910917005

(51) Int. Cl.
*G06N 3/063* (2023.01)
*G06N 3/065* (2023.01)
(Continued)

(52) U.S. Cl.
CPC .............. *G06N 3/063* (2013.01); *G06N 3/065* (2023.01); *H10B 63/84* (2023.02); *H10N 70/20* (2023.02); *H10B 63/00* (2023.02)

(58) Field of Classification Search
CPC .......... G06N 3/04; G06N 3/049; G06N 3/063; G06N 3/065; G06N 3/08
See application file for complete search history.

(56) References Cited

U.S. PATENT DOCUMENTS

| 2015/0193680 A1* | 7/2015 | Chan ........................ G06N 3/08 706/20 |
| 2016/0004960 A1* | 1/2016 | Saïghi ...................... G06N 3/08 706/26 |

(Continued)

OTHER PUBLICATIONS

A. Zhang et al. An Artificial Neuron Based on a Threshold Switching Memristor IEEE Electron Device Letters, vol. 39, No. 2, Feb. 2018 (Year: 2018).*

*Primary Examiner* — Steven L Yeninas (57) ABSTRACT

Disclosed are an artificial sensory nervous circuit and a manufacturing method thereof. The artificial sensory nervous circuit includes a sensor (S), a first memristor (RS), and a neuron circuit, where the first memristor (RS) has a unidirectional resistance characteristic. The sensor (S) is configured to sensing an external signal and generating an excitation signal according to the external signal. The first memristor (RS) is configured to generating a response signal according to the excitation signal. The neuron circuit is configured to perform charging and discharging according to the response signal so as to output a pulse signal. With the artificial sensory nervous circuit and the manufacturing (Continued)

method thereof, sensitivity and habituation characteristics of biological perception are realized by using a simple circuit.

10 Claims, 7 Drawing Sheets

(51) Int. Cl.
*H10B 63/00* (2023.01)
*H10N 70/20* (2023.01)

(56) References Cited

U.S. PATENT DOCUMENTS

2017/0083810 A1* 3/2017 Ielmini .................. G06N 3/049
2020/0175359 A1* 6/2020 Im .......................... G06N 3/065

* cited by examiner

ARTIFICIAL SENSORY NERVOUS CIRCUIT AND MANUFACTURING METHOD THEREOF

CROSS-REFERENCE TO RELATED APPLICATIONS

This application claims the priority of Chinese Patent Application No. 201910917005.3 filed in China on Sep. 26, 2019, the entire content of which is incorporated herein by reference.

TECHNICAL FIELD

The present disclosure belongs to the technical field of bionic electronics, and in particular relates to an artificial sensory nervous circuit and a manufacturing method thereof.

BACKGROUND OF THE INVENTION

A sensory nervous system plays as an important channel for organisms to perceive information from the outside world. Therefore, artificial sensory nervous circuits have a wide range of application scenarios, for example, may be used in fields such as intelligent robots, artificial limbs, and artificial skin. Non-associative learning is a learning form that forms no any clear connection between stimulus and response, and also a learning process in which a single pattern of stimuli is repeatedly presented to correspondingly cause excitement change of a single receptive system in the brain. Sensitivity and habituation characteristics are typical non-associative learning modes. At present, a circuit that implements sensitivity and habituation characteristics based on traditional CMOS circuits is complex in structure, while a circuit which implements a sensory nervous system based on new devices only enables perception of external signals, but fails to enable the realization of sensitivity and habituation characteristics.

SUMMARY OF THE INVENTION

In view of the problem in the prior art, the present disclosure provides an artificial sensory nervous circuit and a manufacturing method thereof, which are adopted to solve the problem in the prior art that a circuit that implements sensitivity and habituation characteristics based on CMOS circuits is complex in structure.

In one aspect of the present disclosure, an artificial sensory nervous circuit is provided, including a sensor, a first memristor, and a neuron circuit, wherein the first memristor has a unidirectional resistance switching characteristic;
 the sensor is configured to sense an external signal and generate an excitation signal according to the external signal;
 the first memristor is configured to generate a response signal according to the excitation signal;
 the neuron circuit is configured to perform charging and discharging according to the response signal so as to output a pulse signal.

In some embodiments, the neuron circuit may include further an energy storage capacitor, a second memristor, and an output resistor, wherein the second memristor has a threshold transition characteristic;
 one end of the sensor is connected to one end of the first memristor, and the other end of the first memristor is connected to one end of the energy storage capacitor and one end of the second memristor; the other end of the second memristor is connected to one end of the output resistor and is applicable to output the pulse signal; the other end of the sensor, the other end of the energy storage capacitor, and the other end of the output resistor are grounded.

In another aspect of the present disclosure, provided is a method for manufacturing an artificial sensory nervous circuit, the method comprises steps of:
 preparing a neuron circuit, which is configured to perform charging and discharging according to a response signal so as to output a pulse signal;
 preparing a first memristor connected in series with the neuron circuit, wherein the first memristor has a unidirectional resistance switching characteristic and is configured to generate the response signal according to an excitation signal; and
 preparing a sensor connected in parallel with the neuron circuit and the first memristor, wherein the sensor is configured to sense an external signal and generate the excitation signal according to the external signal.

In some embodiments, preparing the neuron circuit may include steps of:
 preparing an output resistor;
 preparing a second memristor connected in series with the output resistor, wherein the second memristor has a threshold transition characteristic; and
 preparing an energy storage capacitor connected in parallel with the output resistor and the second memristor.

In some embodiments, preparing the output resistor may include steps of:
 providing an semiconductor substrate;
 depositing a first isolation layer on a surface of the semiconductor substrate;
 depositing a first electrode layer on a surface of the first isolation layer; and
 depositing a resistance film on a first area of a surface of the first electrode layer.

In some embodiments, preparing the second memristor connected in series with the output resistor may include steps of:
 depositing a second electrode layer on a surface of the resistance film;
 depositing a first functional layer on a surface of the second electrode layer, wherein a material of the first functional layer enables the second memristor to have a threshold transition characteristic; and
 deposing a third electrode layer on a surface of the first functional layer.

In some embodiments, preparing the energy storage capacitor connected in parallel with the output resistor and the second memristor may include steps of:
 depositing a capacitor film on a second area of the surface of the first electrode layer, wherein the second area and the first area do not overlap with each other;
 forming a second isolation layer on a third area of the surface of the first electrode layer, wherein the second isolation layer is configured to isolate the energy storage capacitor apart from the second memristor, and the third area is an area of the surface of the first electrode layer excluding the first area and the second area; and
 depositing a fourth electrode layer on a surface of the capacitor film.

In some embodiments, a surface of the third electrode layer, a surface of the second isolation layer, and a surface of the fourth electrode layer may be located in a same plane.

In some embodiments, preparing the first memristor connected in series with the neuron circuit may include steps of:
depositing a fifth electrode layer on the surface of the third electrode layer, the surface of the second isolation layer, and the surface of the fourth electrode layer;
depositing a second functional layer on a surface of the fifth electrode layer, wherein a material of the second functional layer enables the first memristor to have an unidirectional resistance switching characteristic; and
depositing a sixth electrode layer on a surface of the second functional layer.

In some embodiments, preparing the sensor connected in parallel with the neuron circuit and the first memristor may include steps of:
depositing a sensing material layer on a surface of the sixth electrode layer; and
depositing a seventh electrode layer on a surface of the sensing material layer.

In an artificial sensory nervous circuit and manufacturing method thereof according to one or more embodiments of the present disclosure, the artificial sensory nervous circuit includes a sensor, a first memristor, and a neuron circuit. When identical repetitive external signals are continuously sensed by the sensor, the sensor will generate a series of repetitive excitation signals, which are used as input signals of the first memristor. Since the first memristor has a unidirectional resistance switching characteristic, under the identical repetitive excitation signals, a weight of the first memristor can enable a response trend that which augments at first and attenuates then. The response signal generated by the first memristor is used as an input signal of the neuron circuit to switch charging and discharging processes of the neuron circuit, so that a frequency of a pulse signal output by the artificial sensory nervous circuit changes from high to low, that is, enabling a sensitivity and habitation function. Therefore, the present disclosure uses a simple circuit structure to realize sensitivity and habituation characteristics of biological perception.

BRIEF DESCRIPTION OF THE DRAWINGS

By reading detailed description of the preferred embodiments below, various other advantages and benefits will become clear to those of ordinary skill in the art. The drawings are only used for a purpose of illustrating the preferred embodiments, and should not be considered as a limitation to the present disclosure. Also, throughout the drawings, the same reference symbol is configured to denote the same component. In the figures.

DETAILED DESCRIPTION OF THE INVENTION

Hereinafter, exemplary embodiments of the present disclosure will be described in more detail with reference to the accompanying drawings. Although the drawings show exemplary embodiments of the present disclosure, it should be understood that the present disclosure can be implemented in various forms and should not be limited by the embodiments set forth herein. Rather, these embodiments are provided to enable a more thorough understanding of the present disclosure and to fully convey the scope of the present disclosure to those skilled in the art.

The technical solution of the present disclosure will be further described in detail below through the accompanying drawings and specific embodiments.

Figure 1:
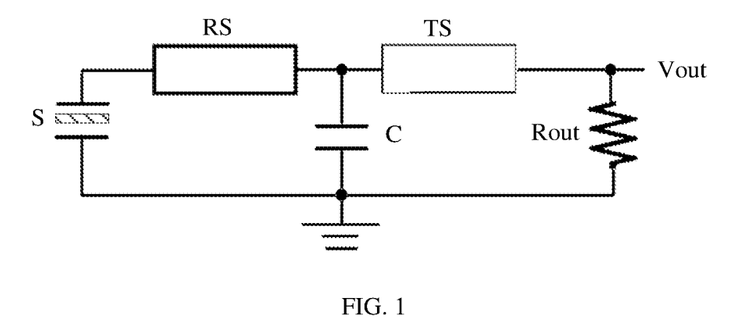
FIG. 1 is a schematic diagram of a circuit structure of an artificial sensory nervous circuit according to an embodiment of the disclosure.

In one aspect of the present disclosure, an artificial sensory nervous circuit is provided, as shown in FIG. 1. FIG. 1 is a schematic diagram of a circuit structure of the artificial sensory nervous circuit. The artificial sensory nervous circuit includes a sensor S, a first memristor RS, and a neuron circuit.

The sensor S is configured to sense an external signal and generate an excitation signal based on the external signal. The sensor S may be a photoelectric sensor, a pressure sensor, etc., and a type of the sensor S may be determined according to an actual application scenario. The first memristor RS is configured to generate a response signal based on the excitation signal. In this embodiment, the first memristor RS has a unidirectional resistance switching characteristic. The unidirectional resistance switching characteristic is also referred to as unipolar resistance switching behavior, which means that a behavior of switching resistance does not depend on the polarity of an applied voltage. It is assumed that an initial state of a device is On/Off, when a voltage reaches a reset/set voltage, a resetting/setting action takes place, and the device becomes a high-impedance/low-impedance state, i.e., Off/On. At this time, either a positive (or negative) scanning is continued or a scanning is restarted from a zero voltage, the device would still remain Off/On until the set/reset voltage is reached, then the device will change from Off/On to On/Off.

The neuron circuit is configured to charge and discharge in accordance with the response signal so as to output a pulse signal Vout. In this embodiment, the neuron circuit includes an energy storage capacitor C, a second memristor TS, and an output resistor Rout. The second memristor TS has a threshold transition characteristic. The threshold transition characteristic means that when a voltage is applied to a single device, if the applied voltage exceeds a threshold voltage of the device, an impedance state of the device will change from a high-impedance state to a low-impedance state; if the applied voltage is lower than a holding voltage of the device, the impedance state of the device will return to the high-impedance state. One end of the sensor S is connected to one end of the first memristor RS, and the other end of the first memristor RS is connected to one end of the energy storage capacitor C and one end of the second memristor TS. The other end of the second memristor TS is connected to one end of the output resistor Rout and is applicable to output the pulse signal Vout. The other end of the sensor S, the other end of the energy storage capacitor C, and the other end of the output resistor Rout are grounded.

The present disclosure provides specific structures of the second memristor TS and the first memristor RS. The second memristor TS includes a first lower electrode, a first upper electrode, and a first functional layer disposed between the first lower electrode and the first upper electrode. The first lower electrode serves as a bottom electrode, a material of which may be an inert conductive material such as Pd, Pt, Si, W or Au, and a thickness of which may be 10 nm to 200 nm. A material of the first functional layer may be a mixture of materials such as $SiO_2$, $SiO_2$: Ag, $NbO_x$, $HfO_2$, $SiN_x$, $TaO_x$ or a-Si, wherein a value of x varies depending on different stoichiometric ratios, and a thickness thereof may be 3 nm to 50 nm. The first upper electrode serves as a top electrode, a material of which may be is a conductive material such as TiN, Ag, or Cu, and a thickness of which may be 10 nm to 100 nm. The first memristor RS includes a second lower electrode, a second upper electrode, and a second functional layer disposed between the second lower electrode and the second upper electrode. The second lower electrode serves as a bottom electrode, a material of which may be an inert conductive material such as Pd, Pt, W or Au, and a thickness of which may be 10 nm to 200 nm. A material of the second functional layer may be a mixture of materials such as $CO_2O_4$, $Al_2O_3$, $SiO_x$, $Li_xSiO_y$, $TiO_x$ or $HfO_x$, wherein values of x and y vary depending on different stoichiometric ratios, and a thickness thereof may be 3 nm to 50 nm. The second upper electrode serves as a top electrode, a material of which may be a conductive material such as TiN, Pd, Pt, W, Cu, Ag or Au, a thickness of which may be 10 nm to 100 nm. It should be noted that the specific structures of the second memristor TS and the first memristor RS are not limited to the structures described in the present embodiment, any memristor can be used as the second memristor as long as it has the threshold transition characteristic, and any memristor having the unidirectional resistance switching characteristic can be used as the first memristor RS.

Figure 2:
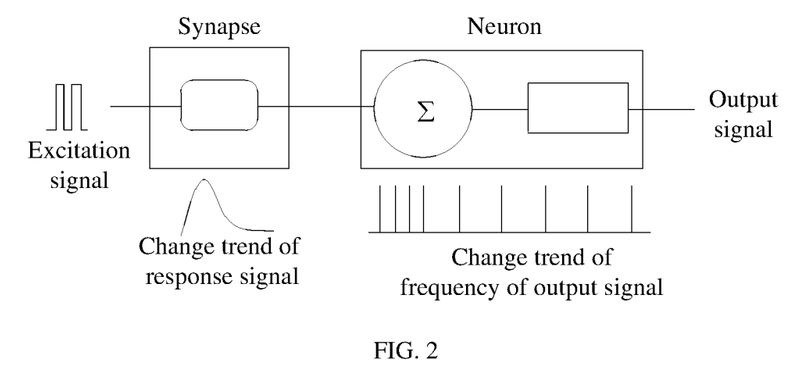
FIG. 2 is a diagram showing response trends of various modules when identical repetitive external signals are received by an artificial sensory nervous circuit according to an embodiment of the disclosure.

FIG. 2 is a diagram showing response trends of various modules when the artificial sensory nervous circuit receives identical repetitive external signals. The first memristor RS acts as a synapse, and the neuron circuit acts as a neuron. When the identical repetitive external signals are continuously sensed by the sensor S, the sensor S will generate a series of repetitive excitation signals, which are regarded as input signals of the first memristor RS. Since the first memristor RS has a unidirectional resistance switching characteristic, under the identical repetitive excitation signals, a weight of the first memristor RS can enable a response trend which augments at first and attenuates then. The response signal generated by the first memristor RS is used as an input signal of the neuron circuit to switch charging and discharging processes of the neuron circuit, so that a frequency of the pulse signal Vout output by the artificial sensory nervous circuit changes from high to low, that is, enabling a sensitivity and habituation function.

Figure 3:
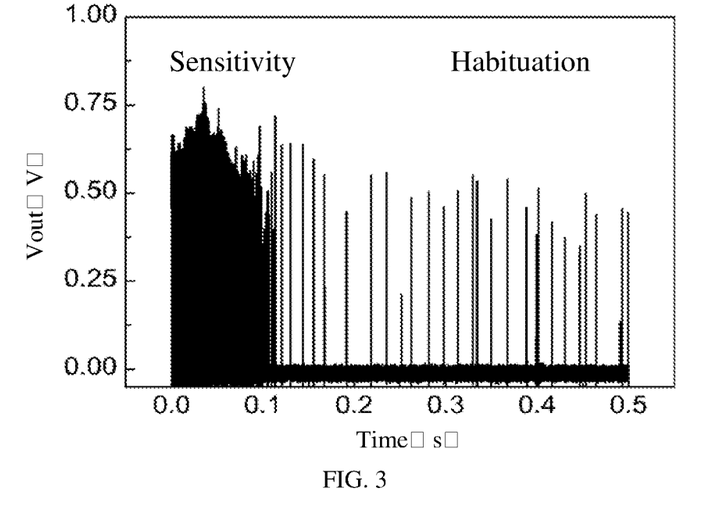
FIG. 3 is a diagram showing a response trend of an output pulse signal when identical repetitive external signals are received by an artificial sensory nervous circuit according to an embodiment of the disclosure.

FIG. 3 is a diagram showing a response trend of a pulse signal Vout output by the artificial sensory nervous circuit when it receives identical repetitive external signals. It can be seen from FIG. 3 that when the identical repetitive external signals are continuously sensed by the sensor S, a response frequency of the entire system can enable a transition from high to low, that is, the sensitivity and habituation characteristics are enabled. Therefore, the present disclosure adopts a simple circuit structure to realize the sensitivity and habituation characteristics of biological perception.

Figure 4:
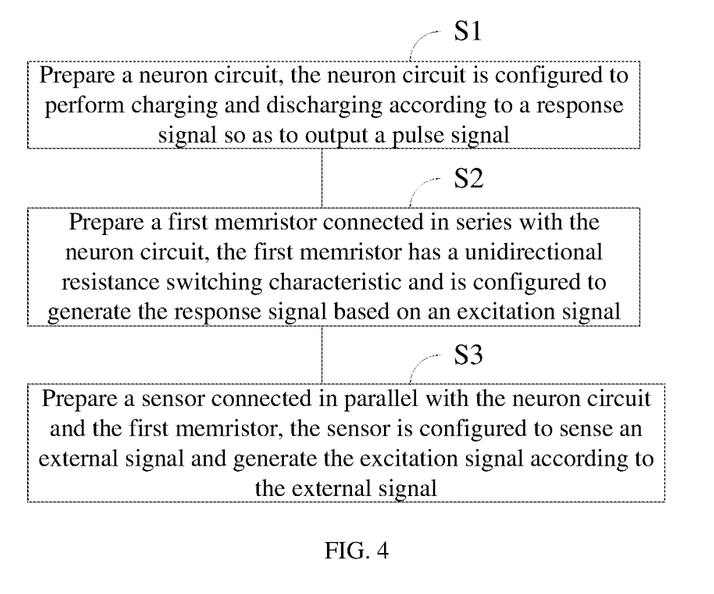
FIG. 4 is a flowchart of a method for manufacturing an artificial sensory nervous circuit according to an embodiment of the disclosure.

In another aspect of the present disclosure, a method for manufacturing an artificial sensory nervous circuit is provided. FIG. 4 is a flowchart of a method for manufacturing an artificial sensory nervous circuit. The method for manufacturing the artificial sensory nervous circuit includes the following steps S1 to S3:

in S1, a neuron circuit is prepared, which is configured to perform charging and discharging based on a response signal so as to output a pulse signal;

in S2, a first memristor connected in series with the neuron circuit is prepared, the first memristor having a unidirectional resistance switching characteristic and being configured to generate the response signal in accordance with an excitation signal; and in S3, a sensor connected in parallel with the neuron circuit and the first memristor is prepared, the sensor being configured to sense an external signal and generate the excitation signal based on the external signal.

Figure 5:
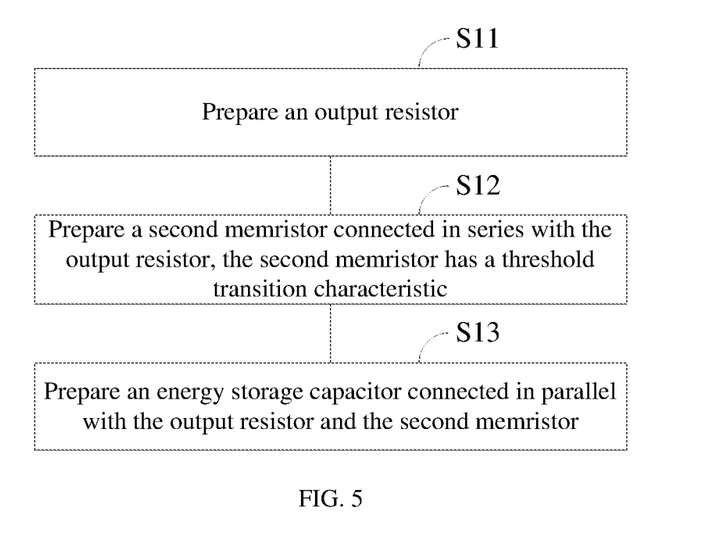
FIG. 5 is a flowchart of a method for manufacturing a neuron circuit according to an embodiment of the disclosure.

FIG. 5 is a flowchart of a method for manufacturing the neuron circuit. The method for manufacturing the neuron circuit includes the following steps S11 to S13:

in S11, an output resistor is prepared;

in S12, a second memristor connected in series with the output resistor is prepared, the second memristor having a threshold transition characteristic; and in S13, an energy storage capacitor connected in parallel with the output resistor and the second memristor is prepared.

Figure 6A:
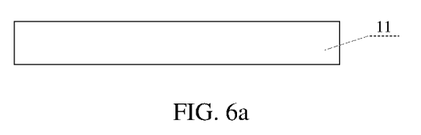
FIGS. 6a to 6d are flowcharts of a method for preparing an output resistor according to an embodiment of the disclosure.

As shown in FIG. 6a, a semiconductor substrate 11 is provided. The semiconductor substrate 11 may be a silicon substrate, a quartz substrate, or an organic flexible film substrate, etc.

Figure 6B:
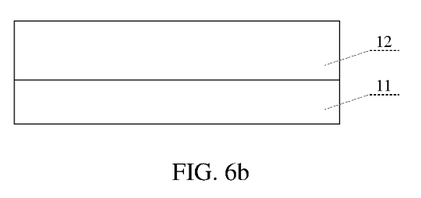

As shown in FIG. 6b, a first isolation layer 12 is deposited on a surface of the semiconductor substrate 11. In some embodiments, the first isolation layer 12 may be deposited on the surface of the semiconductor substrate 11 by a chemical vapor deposition or thermal oxidation method. A material of the first isolation layer 12 may be $SiO_2$ or SiN, and a thickness thereof may be 100 nm to 300 nm. Of course, the thickness of the first isolation layer 12 may also be reduced or increased according to practical process conditions, which is not limited any further in this embodiment.

Figure 6C:
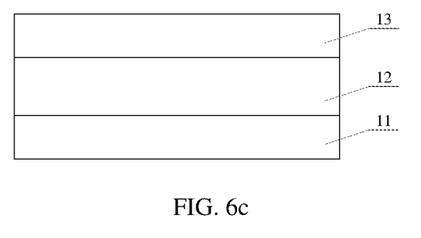

As shown in FIG. 6c, a first electrode layer 13 is deposited on a surface of the first isolation layer 12. In some embodiments, the first electrode layer 13 may be deposited on the surface of the first isolation layer 12 by magnetron sputtering, ion beam sputtering, or electron beam evaporation. The first electrode layer 13 serves as an electrode of the output resistor. A material of the first electrode layer 13 is not limited in this embodiment as long as it is a conductive material. A thickness of the first electrode layer 13 is 10 nm to 200 nm.

Figure 6D:
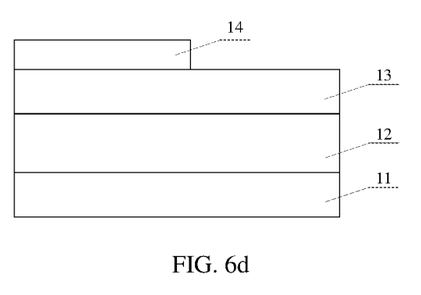

As shown in FIG. 6d, a resistance film 14 is deposited on a first area of a surface of the first electrode layer 13. In some embodiments, the resistance film 14 may be deposited on the first area by magnetron sputtering, ion beam sputtering, or electron beam evaporation. Resistance of the resistance film 14 is 1 Ω~1 MΩ, and the resistance and a thickness of the resistance film 14 may be set according to a practical requirement.

Figure 7A:
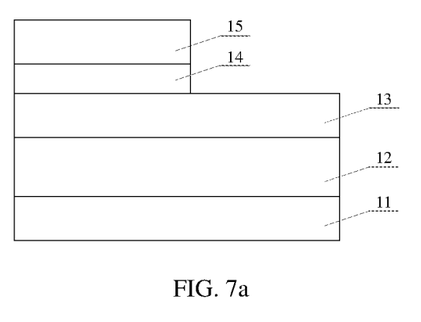
FIGS. 7a to 7c are flowcharts of a method for preparing a second memristor connected in series with an output resistor according to an embodiment of the disclosure.

As shown in FIG. 7a, a second electrode layer 15 is deposited on a surface of the resistance film 14. In some embodiments, the second electrode layer 15 may be deposited on the surface of the resistance film 14 by magnetron sputtering, ion beam sputtering, or electron beam evaporation. The second electrode layer 15 serves as a bottom electrode of the second memristor, and a material thereof may be an inert conductive material such as Pd, Pt, Si, W or Au, and a thickness thereof may be 10 nm to 200 nm.

Figure 7B:
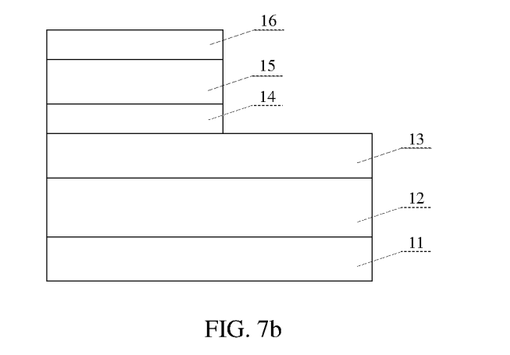

As shown in FIG. 7b, a first functional layer 16 is deposited on a surface of the second electrode layer 15. A resistance switching device prepared based on a material of the first functional layer 16 has a threshold transition characteristic, that is, the material of the first functional layer 15 enables the second memristor to have the threshold transition characteristic. In some embodiments, the first functional layer 16 may be deposited on the surface of the second electrode layer 15 by chemical vapor deposition, magnetron sputtering, electron beam evaporation, pulsed laser deposition, or atomic layer deposition. The material of the first functional layer 16 may be a mixture of materials such as $SiO_2$, $SiO_2$: Ag, $NbO_x$, $HfO_2$, $SiN_x$, $TaO_x$, or a-Si, wherein a value of x varies depending on different stoichiometric ratios. Of course, the material of the first functional layer 16 is not limited to the above materials, and any material can be used as long as it enables the second memristor to have the threshold transition characteristic. In some embodiments, a thickness of the first functional layer 16 is 3 nm to 50 nm.

Figure 7C:
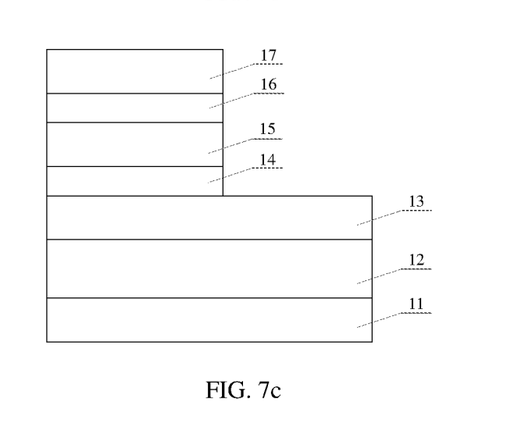

As shown in FIG. 7c, a third electrode layer 17 is deposited on a surface of the first functional layer 16. In some embodiments, the third electrode layer 17 may be deposited on the surface of the first functional layer 16 by magnetron sputtering, ion beam sputtering, or electron beam evaporation. The third electrode layer 17 serves as a top electrode of the second memristor, a material thereof may be a conductive material such as Cu, TiN or Ag, and a thickness thereof may be 10 nm to 100 nm.

Figure 8A:
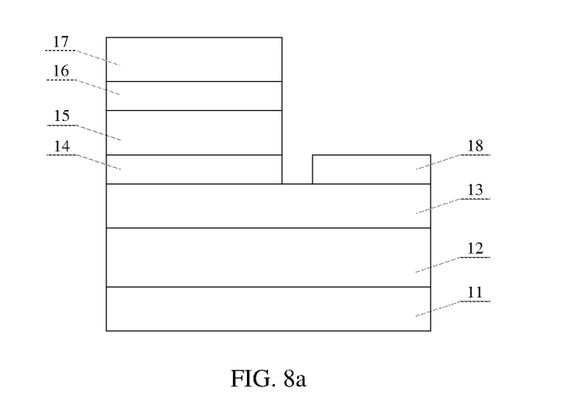
FIGS. 8a to 8c are flowcharts of a method for preparing an energy storage capacitor connected in parallel with an output resistor and a second memristor according to an embodiment of the disclosure.

As shown in FIG. 8a, a capacitor film 18 is deposited on a second area of the surface of the first electrode layer 13, and the second area does not overlap with the first area. In some embodiments, the capacitor film 18 may be deposited on the second area by magnetron sputtering, ion beam sputtering or electron beam evaporation. A dielectric constant and a thickness of the capacitor film 18 may be set according to a practical requirement.

Figure 8B:
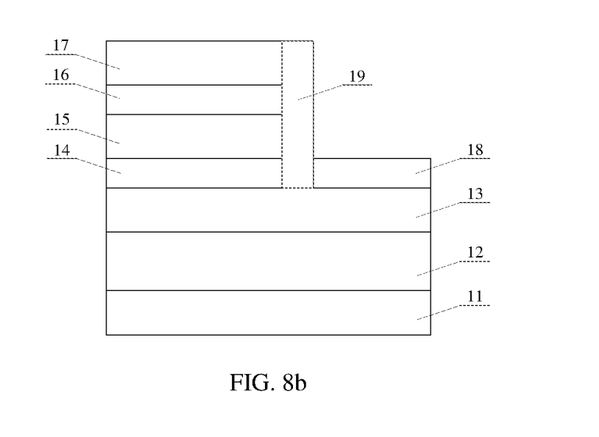

As shown in FIG. 8b, a second isolation layer 19 is formed on a third area of the surface of the first electrode layer 13. The third area is an area of the surface of the first electrode layer 13 other than the first area and the second area. The second isolation layer 19 is configured to isolate the second memristor apart from the energy storage capacitor, and a material thereof may be $SiO_2$ or SiN or the like. In some embodiments, the second isolation layer 19 may be formed by using an etching process or a lift-off process. If the second isolation layer 19 is formed by an etching process, isolation layers are deposited on a surface of the third electrode layer 17, a surface of the capacitor film 18, and the third area, respectively; and then a photoresist layer is formed on a surface of the isolation layer on the third area or is protected through a mask, and other areas are etched until the third electrode layer 17 and the capacitor film 18 are exposed; finally, the photoresist layer on the surface of the isolation layer is removed or the mask is removed so that the second isolation layer 19 is formed. If the second isolation layer 19 is formed by a lift-off process, a photoresist layer is formed on the surface of the third electrode layer 17, the surface of the capacitor film 18 and the third area, the photoresist layer is subjected to photolithographic development to expose the third area; then an isolation layer is deposited on a surface of the photoresist layer and the third area; finally, the photoresist layer is removed so that the second isolation layer 19 is formed.

Figure 8C:
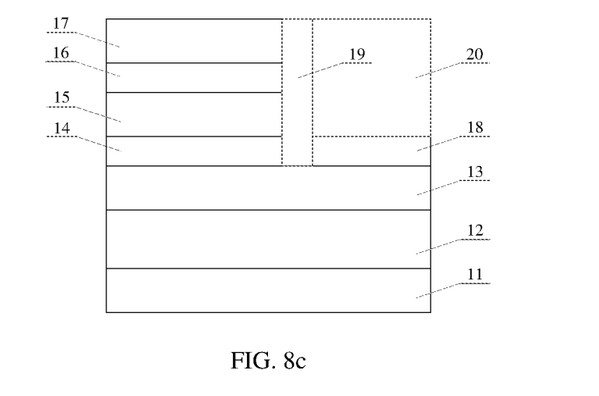

As shown in FIG. 8c, a fourth electrode layer 20 is deposited on the surface of the capacitor film 18. In some embodiments, the fourth electrode layer 20 may be deposited on the surface of the capacitor film 18 by atomic layer deposition, magnetron sputtering or ion beam sputtering, and a material of the fourth electrode layer 20 may be an inert conductive material such as Pd, Pt, W, or Au, and a thickness thereof may be set according to a practical requirement.

It should be noted that the surface of the third electrode layer 17, a surface of the second isolation layer 19, and a surface of the fourth electrode layer 20 may be or may not be located in the same plane. This embodiment does not make limitation is on this matter.

Figure 9A:
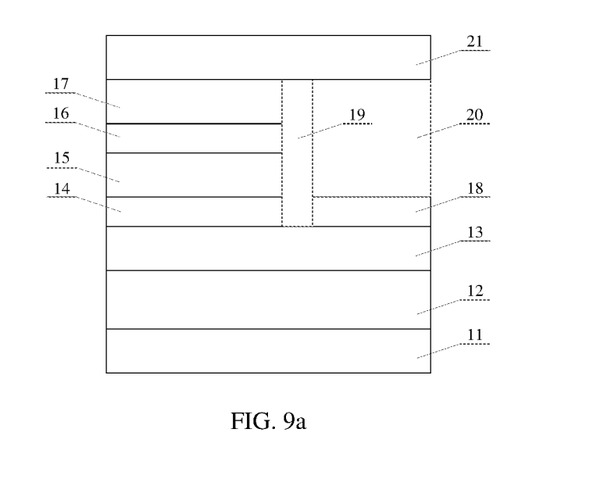
FIGS. 9a to 9c are flowcharts of a method for preparing a first memristor connected in series with a neuron circuit according to an embodiment of the disclosure.

As shown in FIG. 9a, a fifth electrode layer 21 is deposited on the surface of the third electrode layer 17, the surface of the second isolation layer 19 and the surface of the fourth electrode layer 20. In some embodiments, the fifth electrode layer 21 may be deposited on the surface of the third electrode layer 17, the surface of the second isolation layer 19, and the surface of the fourth electrode layer 20 by magnetron sputtering, ion beam sputtering, or electron beam evaporation. The fifth electrode layer 21 serves as a bottom electrode of the first memristor, and a material thereof may be an inert conductive material such as Pd, Pt, W, or Au, and a thickness thereof may be 10 nm to 200 nm.

Figure 9B:
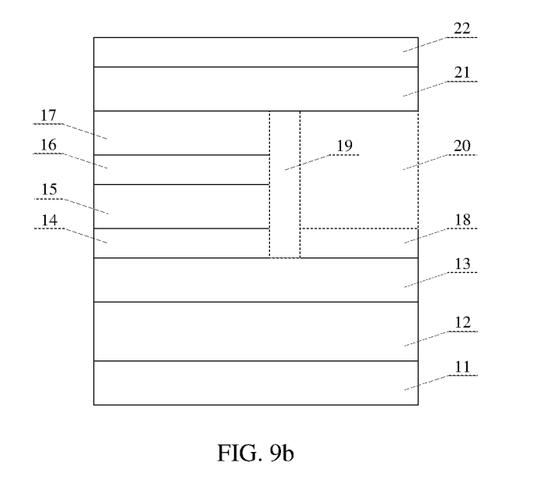

As shown in FIG. 9b, a second functional layer 22 is deposited on a surface of the fifth electrode layer 21, and the resistance switching device prepared based on a material of the second functional layer 22 has a unidirectional resistance switching characteristic, that is, the material of the second functional layer 21 enables the first memristor to have the unidirectional resistance switching characteristic. In some embodiments, the second functional layer 22 may be deposited on the surface of the fifth electrode layer 21 by chemical vapor deposition, magnetron sputtering, electron beam evaporation, pulsed laser deposition, or atomic layer deposition. A material of the second functional layer 22 may be a mixture of materials such as $CO_2O_4$, $Al_2O_3$, $SiO_x$, $Li_xSiO_y$, $TiO_x$ or $HfO_x$, wherein values of x and y are varied depending on different stoichiometric ratios. Of course, the material of the second functional layer 22 is not limited to the above materials, and any material can be used as long as it enables the first memristor to have the unidirectional resistance switching characteristic. In some embodiments, a thickness of the second functional layer 22 is 3 nm to 50 nm.

Figure 9C:
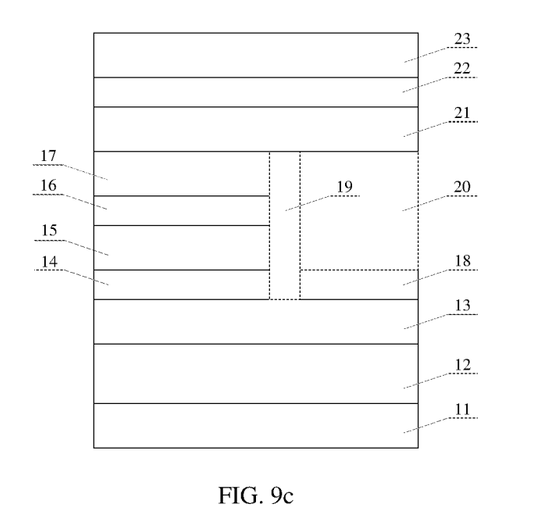

As shown in FIG. 9c, a sixth electrode layer 23 is deposited on a surface of the second functional layer 22. In some embodiments, the sixth electrode layer 23 may be deposited on the surface of the second functional layer 22 by magnetron sputtering, ion beam sputtering, or electron beam evaporation. The sixth electrode layer 23 serves as a top electrode of the first memristor, a material thereof may be a conductive material such as TiN, Pd, Pt, W, Cu, Ag, or Au, and a thickness thereof is 10 nm to 100 nm.

Figure 10A:
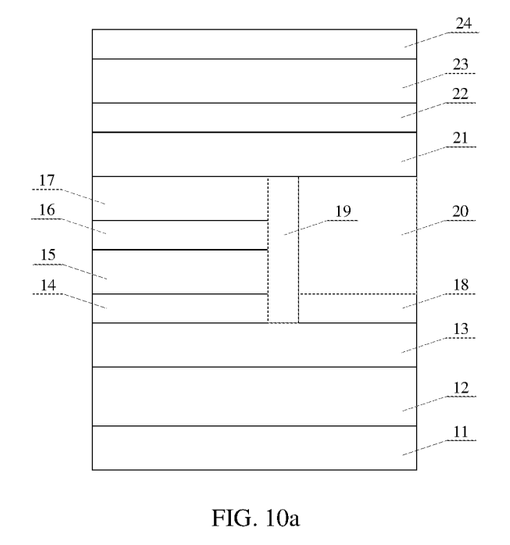
FIGS. 10a and 10b are flowcharts of a method for preparing an energy storage capacitor connected in parallel with an output resistor and a second memristor according to an embodiment of the disclosure.

As shown in FIG. 10a, a sensor material layer 24 is deposited on a surface of the sixth electrode layer 23. In some embodiments, the sensing material layer 24 may be deposited on the surface of the sixth electrode layer 23 by magnetron sputtering, ion beam sputtering, or electron beam evaporation. A material and a thickness of the sensing material layer 24 may be selected according to different requirements. For example, for preparing a pressure sensor, the material of the sensing material layer 24 may be $BaTiO_3$ (BTO)/bacterial cellulose (BC), $K_{0.5}Na_{0.5}NbO_3$—$BaTiO_3$/ polyvinylidene fluoride (PVDF), crystal (quartz crystal), lithium gallate or lithium germanate, etc.; and for preparing a photoelectric sensor, the material of the sensing material layer 24 may be cadmium sulfide, cadmium selenide, cadmium telluride, gallium arsenide or zinc sulfide, etc.

Figure 10B:
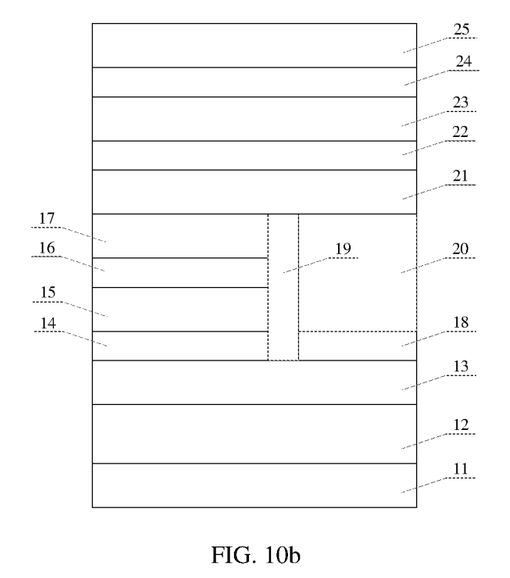

As shown in FIG. 10b, a seventh electrode layer 25 is deposited on a surface of the sensing material layer 24. In some embodiments, the seventh electrode layer 25 may be deposited on the surface of the sensing material layer 24 by magnetron sputtering, ion beam sputtering, or electron beam evaporation. The seventh electrode layer 25 serves as a ground electrode. A material of the seventh electrode layer 25 is not limited in this embodiment as long as it is a conductive material. A thickness of the seventh electrode layer 25 is 10 nm to 200 nm.

In the artificial sensory nervous system prepared according to the methods of one or more embodiments of the present disclosure, when an identical repetitive external signal is continuously sensed by the sensor, the sensor will generate a series of repetitive excitation signals, which serve as an input signal of the first memristor. Since the first memristor has a unidirectional resistance switching characteristic, under the identical repetitive excitation signals, a weight of the first memristor can enable a response trend which augments at first and attenuates then. The response signal generated by the first memristor is used as an input signal of the neuron circuit to switch charging and discharging processes of the neuron circuit, so that a frequency of a pulse signal output by the artificial sensory nervous circuit changes from high to low, that is, the sensitivity and habitation function is realized.

These above are only the preferred embodiments of the present disclosure and are not intended to limit the scope of protection of the present disclosure. Any modification, equivalent replacement and improvement made within the spirit and principle of the present disclosure shall be included in the protection scope of this disclosure.

The invention claimed is:

1. An artificial sensory nervous circuit, comprising a sensor, a first memristor and a neuron circuit, wherein the first memristor has a unidirectional resistance switching characteristic;
   the sensor is configured to sense an external signal and generate an excitation signal according to the external signal;
   the first memristor is configured to generate a response signal according to the excitation signal; and
   the neuron circuit is configured to perform charging and discharging according to the response signal so as to output a pulse signal.

2. The artificial sensory nervous circuit according to claim 1, wherein the neuron circuit comprises an energy storage capacitor, a second memristor, and an output resistor, wherein the second memristor has a threshold transition characteristic;
   one end of the sensor is connected to one end of the first memristor, and another end of the first memristor is connected to one end of the energy storage capacitor and one end of the second memristor, and another end of the second memristor is connected to one end of the output resistor and is applicable to output the pulse signal, and another end of the sensor, another end of the energy storage capacitor, and another end of the output resistor are grounded.

3. A method for manufacturing an artificial sensory nervous circuit, comprising:
   preparing a neuron circuit, wherein the neuron circuit is configured to perform charging and discharging according to a response signal so as to output a pulse signal;
   preparing a first memristor connected in series with the neuron circuit, wherein the first memristor has a unidirectional resistance switching characteristic and is configured to generate the response signal based on an excitation signal; and
   preparing a sensor connected in parallel with the neuron circuit and the first memristor, wherein the sensor is configured to sense an external signal and generate the excitation signal according to the external signal.

4. The method for manufacturing an artificial sensory nervous circuit according to claim 3, wherein preparing a neuron circuit comprises steps of:
   preparing an output resistor;
   preparing a second memristor connected in series with the output resistor, wherein the second memristor has a threshold transition characteristic; and
   preparing an energy storage capacitor connected in parallel with the output resistor and the second memristor.

5. The method for manufacturing an artificial sensory nervous circuit according to claim 4, wherein preparing an output resistor comprises steps of:
   providing a semiconductor substrate;
   depositing a first isolation layer on a surface of the semiconductor substrate;
   depositing a first electrode layer on a surface of the first isolation layer; and
   depositing a resistance film on a first area of a surface of the first electrode layer.

6. The method for manufacturing an artificial sensory nervous circuit according to claim 5, wherein preparing a second memristor connected in series with the output resistor comprises steps of:
   depositing a second electrode layer on a surface of the resistance film;
   depositing a first functional layer on a surface of the second electrode layer, wherein a material of the first functional layer enables the second memristor to have a threshold transition characteristic; and
   deposing a third electrode layer on a surface of the first functional layer.

7. The method for manufacturing an artificial sensory nervous circuit according to claim 6, wherein preparing an energy storage capacitor connected in parallel with the output resistor and the second memristor comprises steps of:
   depositing a capacitor film on a second area of the surface of the first electrode layer, wherein the second area and the first area do not overlap with each other;
   forming a second isolation layer on a third area of the surface of the first electrode layer, wherein the second isolation layer is configured to isolate the energy storage capacitor apart from the second memristor, and the third area is an area of the surface of the first electrode layer excluding the first area and the second area; and depositing a fourth electrode layer on a surface of the capacitor film.

8. The method for manufacturing an artificial sensory nervous circuit according to claim 7, wherein a surface of the third electrode layer, a surface of the second isolation layer, and a surface of the fourth electrode layer are located in a same plane.

9. The method for manufacturing an artificial sensory nervous circuit according to claim 7, wherein preparing the first memristor connected in series with the neuron circuit comprises steps of:
  depositing a fifth electrode layer on a surface of the third electrode layer, a surface of the second isolation layer, and a surface of the fourth electrode layer;
  depositing a second functional layer on a surface of the fifth electrode layer, wherein a material of the second functional layer enables the first memristor to have an unidirectional resistance switching characteristic; and
  depositing a sixth electrode layer on a surface of the second functional layer.

10. The method for manufacturing an artificial sensory nervous circuit according to claim 9, wherein preparing a sensor connected in parallel with the neuron circuit and the first memristor comprises steps of:
  depositing a sensing material layer on a surface of the sixth electrode layer; and
  depositing a seventh electrode layer on a surface of the sensing material layer.

\* \* \* \* \*